United States Patent
Dragoi (10) Patent No.: US 10,204,812 B2
(45) Date of Patent: Feb. 12, 2019

(54) METHOD FOR ALIGNING SUBSTRATES BEFORE BONDING

(71) Applicant: EV Group E. Thallner GmbH, St. Florian am Inn (AT)

(72) Inventor: Viorel Dragoi, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 15/574,991

(22) PCT Filed: Jun. 1, 2016

(86) PCT No.: PCT/EP2016/062360
§ 371 (c)(1),
(2) Date: Nov. 17, 2017

(87) PCT Pub. No.: WO2016/193296
PCT Pub. Date: Dec. 8, 2016

(65) Prior Publication Data
US 2018/0144967 A1  May 24, 2018

(30) Foreign Application Priority Data

Jun. 5, 2015  (DE) .......................... 10 2015 108 901

(51) Int. Cl.
*H01L 21/68* (2006.01)
*H01L 21/67* (2006.01)
*H01L 23/544* (2006.01)

(52) U.S. Cl.
CPC ...... *H01L 21/681* (2013.01); *H01L 21/67092* (2013.01); *H01L 23/544* (2013.01);
(Continued)

(58) Field of Classification Search
CPC ............. H01L 21/681; H01L 21/67092; H01L 23/544; H01L 2223/5442; H01L 2223/564426
See application file for complete search history.

(56) References Cited

U.S. PATENT DOCUMENTS 6,214,692 B1   4/2001 Thallner
7,964,819 B2   6/2011 Bruland
(Continued)

FOREIGN PATENT DOCUMENTS

DE   112006002263 T5   7/2008
EP        1278245 A1   1/2003
(Continued)

OTHER PUBLICATIONS

International Search Report from corresponding International Patent Application No. PCT/EP2016/062360, dated Aug. 3, 2016.

*Primary Examiner* — Fernando L Toledo
*Assistant Examiner* — Neil R Prasad
(74) *Attorney, Agent, or Firm* — Kusner & Jaffe (57) ABSTRACT

A method and corresponding device for the alignment of a first substrate comprising at least two first alignment marks with a second substrate comprising at least two second alignment marks. By means of a first assignment, the first alignment marks are assigned to at least two first characteristic alignment features of the first substrate in an X-direction and in a Y-direction. By means of a second assignment, the second alignment marks are assigned to at least two second characteristic alignment features of the second substrate in an X-direction and in a Y-direction, and by means of an alignment, the first and second alignment marks are aligned in relation to one another in an X- and Y-direction by means of the first and second characteristic alignment features.

18 Claims, 4 Drawing Sheets

(52) U.S. Cl.
    CPC ................ *H01L 2223/5442* (2013.01); *H01L 2223/54426* (2013.01)

(56) References Cited

U.S. PATENT DOCUMENTS

| | | | | |
|---|---|---|---|---|
| 2006/0141744 A1* | 6/2006 | Best | .................... | G03F 7/70633 |
| | | | | 438/455 |
| 2008/0187413 A1 | 8/2008 | Kondoh | | |
| 2013/0147942 A1 | 6/2013 | Lin et al. | | |
| 2013/0244350 A1* | 9/2013 | Horikoshi | ......... | H01L 21/67092 |
| | | | | 438/16 |
| 2013/0316516 A1* | 11/2013 | Deguchi | ........... | H01L 21/67121 |
| | | | | 438/455 |
| 2017/0278803 A1* | 9/2017 | Sugaya | ................. | H01L 23/544 |

FOREIGN PATENT DOCUMENTS

| | | |
|---|---|---|
| JP | 2009-147257 A | 7/2009 |
| WO | WO 2013/185803 A1 | 12/2013 |
| WO | WO 2014/154272 A1 | 10/2014 |
| WO | WO 2014/202106 A1 | 12/2014 |
| WO | WO 2015/082020 A1 | 6/2015 |
| WO | WO 2015/197112 | 12/2015 |

\* cited by examiner

METHOD FOR ALIGNING SUBSTRATES BEFORE BONDING

FIELD OF INVENTION

The present invention relates to a method for the alignment of a first substrate comprising at least two first alignment marks with a second substrate comprising at least two second alignment marks as well as a corresponding device.

BACKGROUND OF THE INVENTION

There are a number of methods for aligning and bonding two, in particular structured, substrates with one another. In the majority of all the methods, the aligner and the bonder are separate modules/chambers. The aligner orientates two substrates with one another with the aid of alignment marks. Fixing, in particular by clamping, takes place after the alignment. For this purpose, the two substrates are fixed against one another and against a sample holder. The fixing of the substrates to one another without the use of a sample holder is also conceivable. Such fixing without a sample holder is disclosed in publication WO2014154272A1, in which it is shown how a direct fixing of two substrates can take place by means of magnetic bodies.

The substrates fixed to one another then pass by means of a transport system into a bonding system, in which bonding of the two substrates takes place.

A fusion bonder represents a special case of such a bonding system. A fusion bonder is understood to mean a device which produces the bonding of two substrates by an, in particular, concentric contacting with the aid of a pin. As a result of the extremely clean surfaces of the substrates, self-fixing occurs due to the adhesive forces between the substrate surfaces. The adhesive forces are primarily van-der-Waals forces. A bond thus produced is referred to as a prebond, since it does not yet have the full strength that is theoretically to be obtained, which is produced in a further process step by a heat treatment and the accompanying generation of covalent bonds.

There are essentially two major problems with carrying out a fusion bond.

The first problem relates to obtaining alignment accuracy over long distances. Modern aligners are already capable of achieving alignment accuracies of less than 200 nm. This means that two substrates with corresponding alignment marks can be aligned and fixed in relation to one another with greater precision than 100-200 nm. However, this alignment accuracy has to be maintained over times as long as possible and/or over distances as long as possible. Furthermore, the fixing of the two substrates to one another must take place so securely that the achieved alignment accuracy is not lost by a displacement of the substrates in relation to one another, in particular during a handling process, for example by a robot.

The second problem is that the throughput with the alignment and therefore with the production of a bond is usually low with the previously known methods.

In very many cases, a complex and therefore costly aligner is used, which is able to implement different alignment methods, in particular face-to-face, back-to-face or back-to-back alignments.

Thermocompression bonders are a type of bonder preferably used according to the invention. High pressures and high temperatures can be produced with the aid of a thermocompression bonder. It is used preferably for metal diffusion bonding and/or for eutectic bonding. Since the metal surfaces should preferably be completely free from oxides, it is of fundamental importance that the atmosphere in such bonder chambers can be adjusted and monitored in a targeted manner. The present invention not only comprises a simple method of increasing the bonding throughput, but also describes in an advantageous way an embodiment and a method with which a controlled atmosphere can be generated and continuously maintained in a bonding chamber. Such atmospheres are particularly advantageous for the production of pure metal-metal bonds.

It is the problem of the invention to provide a method and a system, with the aid of which an improved and in particular quicker alignment of two substrates in relation to one another can be carried out.

This problem is solved with the features of the independent claim(s). Advantageous developments of the invention are indicated in the sub-claims. All combinations of at least two of the features stated in the description, the claims and/or the figures also fall within the scope of the invention. In the case of the stated value ranges, values lying within the stated limits should also be deemed to be disclosed as limiting values and can be claimed in any combination.

The idea underlying the invention is to provide a method for the alignment of a first substrate comprising at least two first alignment marks with a second substrate comprising at least two second alignment marks, wherein by means of a first assignment, the first alignment marks are assigned to at least two first characteristic alignment features of the first substrate in an X-direction and in a Y-direction, by means of a second assignment, the second alignment marks are assigned to at least two second characteristic alignment features of the second substrate in an X-direction and in a Y-direction and by means an alignment, the first and second alignment marks are aligned in relation to one another in an X- and Y-direction by means of the first and second characteristic alignment features.

According to the device, the invention can be implemented in particular by the following features:

a first assignment module for the assignment of the first assignment marks to at least two first characteristic assignment features of the first substrate in an X-direction and in a Y-direction, a second assignment module for the assignment of the second assignment marks to at least two second characteristic assignment features of the second substrate in an X-direction and in a Y-direction and an alignment module, constituted in particular as a bonding module, for the alignment of the first and second alignment marks in relation to one another in the X- and Y-direction by means of the first and second characteristic alignment features.

An essential feature of the invention in particular is that the first and second alignment marks of the substrates are measured/detected in respect of characteristic substrate features, in particular a flat side and/or a notch, before said substrates are transferred into the bonding system or a bonding module, in particular a fusion bonder, still more preferably a thermocompression bonder. A measurement/detection in respect of other characteristic substrate features that can be identified and detected by optics would also be conceivable. This measurement/detection is carried out with the best possible precision. The measurement is in particular more accurate than 100 μm, preferably more accurate than 10 μm, still more preferably more accurate than 1 μm, most preferably more accurate than 100 nm, most preferably of all more accurate than 50 nm. It is also conceivable for an indication to be given concerning the accuracy of the rotation of the substrates (angular position in rotation) in relation to one another. The substrates are orientated in particular more accurate than 1°, more preferably more accurate than 0.1°, still more preferably more accurate than 0.01°, most preferably more accurate than 0.001°, most preferably of all more accurate than 0.0001° in respect of their rotational orientation in relation to one another.

On the basis of the measurement/detection, an exact positional chart of the alignment marks in relation to the characteristic substrate features is prepared (assignment). As a result of this preliminary measurement, only one alignment in respect of the characteristic substrate features needs to be carried out in the bonding station, and in particular not in respect of the first and/or second alignment marks. This is particularly advantageous when the alignment marks are located on the substrate surfaces to be bonded together and would thus have to be aligned by a very precise, but laborious alignment procedure. Aligners, which carry out such a face-to-face alignment, are disclosed for example in publications PCT/EP2013/075831, WO2014202106A1 or U.S. Pat. No. 6,214,692B1. Apart from the mentioned publications, there are also other aligners which perform a face-to-face alignment by the insertion of optics between the substrates. According to the invention, therefore, the introduction of an optical measuring device between the substrates or a relative displacement of the two substrates in relation to one another for the measurement can be dispensed with.

In particular, the idea underlying the invention is also to perform an assignment of the alignment marks, in particular spaced apart from the lateral boundary, to characteristic substrate features, in particular disposed at the lateral boundary, in an X-Y plane corresponding in particular to the respective substrate surface, in particular before the transfer into the bonding chamber. The assignment takes place in particular by defining a corresponding factor in a defined vector space, preferably at least related to the X-Y plane.

The invention thus relates in particular to a device and a method for increasing the throughput of a bonding system. The bonding system preferably comprises at least one bonding chamber and at least two assignment modules, which are constituted in particular as locks and in which a measurement of the first and second substrates takes place in each case. A transfer means, preferably a robot, conveys the first and second substrates in each case from the locks into the bonding chamber of a bonding system or of a bonding module. The orientation of the two substrates takes place in the bonding chamber on the basis of the characteristic features and/or the contacting of the two substrates. As a further particularly preferred feature according to the invention, the possibility is disclosed whereby the robot, which performs the transport of the substrates out of the assignment modules into the bonding chamber, already deposits the substrates in the bonding chamber in such a way that a further alignment in the bonding chamber is not necessary. The depositing thus implies alignment in this embodiment. The two substrates are then bonded together in the bonding system after being deposited. The bonding system/bonding module is in particular a fusion bonder, even more preferably a thermocompression bonder.

In other words, the present invention is based in particular on assigning respectively corresponding first and second characteristic substrate features corresponding to alignment marks by measurement/detection prior to a transfer of the first and second substrates. The assignment especially takes place in each case in an X-Y plane defined by an X-direction and a Y-direction and parallel to the first and second substrate surfaces.

A major advantage of the inventive embodiment according to one or more of the above-described features is primarily the fact that a relatively accurate measurement of the first and second alignment marks can take place in a location outside the bonding module, in particular in a lock. As a result of the measurement of the substrate surfaces and the accurate charting of the alignment marks in relation to the characteristic substrate features, the time during which the lock is evacuated can in particular be utilised. In particular, the problem of the alignment of two contact surfaces of the substrates, in particular spaced apart from the lateral boundary, or alignment marks lying on the substrate surfaces in relation to one another is thus solved in that the alignment takes place with the aid of the characteristic substrate features. The latter, especially in the contacted state of the substrates, are still accessible from the exterior at the contact surfaces, so that an alignment can take place up to the contacting, preferably continuously. As a result of this measure, it is possible to dispense with face-to-face alignment strategies or a displacement of the substrates parallel to the substrate surfaces beyond the alignment.

The alignment marks are spaced apart from the characteristic substrate features, wherein the characteristic substrate features are preferably disposed at the lateral boundary or at an outer contour of the substrates defined by the X-Y plane and the alignment marks are spaced apart from the lateral boundary.

According to an embodiment of the invention, provision is made such that, after the first and second assignment and before the alignment, a transfer of the substrates takes place into a bonding module or into a bonding chamber, in which in particular the alignment is carried out, preferably under a gas pressure less than 1 bar, more preferably less than $10^{-3}$ mbar, still more preferably less than $10^{-5}$ mbar, most preferably less than $10^{-8}$ mbar.

An essential aspect according to the invention is according to one embodiment in that the bonding chamber preferably remains continuously evacuated and is not opened to the atmosphere during the operation of the system, while the assignments take place in additional modules. If, after an evacuation, the bonding chamber is flooded with an, in particular non-oxidising, gas or gas mixture, this gas atmosphere is preferably retained.

In a development of the invention, provision is made such that the first assignment takes place in a first assignment module, constituted in particular as a lock, and the second assignment takes place, in particular in parallel with the first assignment, in a second assignment module, constituted in particular as a lock. The assignment is thus not only speeded up, but it is also conceivable for the alignments to be able to take place at the outer sides and/or on existing or subsequently produced contours of the substrates. A rotation of the substrates before the contacting of the substrates for bonding can thus be dispensed with.

Before the alignment, in particular in the first and/or second assignment module, preferably during the assignment, the gas pressure is advantageously reduced, preferably to a gas pressure of less than 1 bar, more preferably less than $10^{-3}$ mbar, still more preferably less than $10^{-5}$ mbar, most preferably less than $10^{-8}$ mbar. It is thus possible—especially when the assignment modules are constituted as locks—for the bonding in the bonding chamber to be speeded up, since the latter no longer needs to be evacuated or no longer evacuated for so long. The evacuation of an assignment module lasts in particular for less than 5 minutes, preferably less than 4 minutes, still more preferably less than 3 minutes, most preferably less than 2 minutes, most preferably of all less than 1 minute. The more rapidly the evacuation takes place, the greater the throughput.

In a further embodiment according to the invention, the measurement of the substrates according to the invention can also take place in an assignment module, which is constituted separate from the bonding chamber. The substrates are then transported over a longer distance into a bonding chamber. In particular, the substrates can be further processed by other process steps between the measurement according to the invention and the actual bonding process in the bonding chamber. The measurement of the substrates in the assignment modules is therefore itself a step according to the invention.

In a further embodiment according to the invention, the measurements can also take place in the assignment modules when the assignment modules are open to the surrounding atmosphere. The assignment modules can thus also be used exclusively for the measurement of the characteristic substrate features, without having to utilise the effect of the measurement during an evacuation. As a further aspect according to the invention, therefore, the assignment module alone is disclosed for the measurement of the characteristic substrate features, independently of an evacuation and/or a connection to a bonder.

Modules

Inasmuch as modules such as in particular assignment modules, alignment modules or measurement modules are described, the latter are constituted in particular as spatially separate chambers, which can preferably be connected to one another via locks. Thus, the chambers are constituted capable of being evacuated, in particular in each case to a gas pressure less than 1 bar, preferably less than $10^{-3}$ mbar, still more preferably less than $10^{-5}$ mbar, most preferably less than $10^{-8}$ mbar. The gas pressures in the chambers are preferably each adjustable separately from and independently of one another. Modules also serve for the preliminary treatment and/or post-treatment of the substrates or the bonded substrate stack. Thus, it is conceivable for the substrates to be inspected, measured, flipped, cleaned, etched and/or coated before they are introduced into the assignment modules according to the invention.

Control System

The control of the device and the described method features preferably takes place by means an, in particular central, control system. The latter is preferably software-controlled or comprises firm- and/or hard- and/or software, which in particular comprises memories for storing data/information in respect of the device and the alignment/assignment.

The Substrates

The substrates can have the any shape, preferably at least a predominantly round and/or flat shape. The substrates are in particular preferably standardised semiconductor substrates, in particular wafers. The substrates are described in particular by their diameter in the circular section. For wafers, use is preferably made of diameters standard in the industry, i.e. 1 inch, 2 inches, 3 inches, 4 inches, 5 inches, 6 inches, 8 inches, 12 inches and 18 inches. However, the embodiment according to the invention can in principle handle any substrate, irrespective of its diameter.

The following two types of wafer are preferably used:

The first type of wafer exhibits a marked divergence from the otherwise circular shape of the wafer, said marked divergence being produced by a straight peripheral section/substrate edge section (flat). The characteristic substrate feature is at least one of the two points of intersection of a straight line running in particular as a secant of the straight peripheral section/substrate edge section. The second type of wafer is circular, apart from a notch. The notch preferably serves for the alignment and/or rough adjustment, i.e. as a characteristic substrate feature.

Characteristic Substrate Features

According to the invention, a characteristic substrate feature is understood to mean, in particular, a point/position unequivocally assignable to the substrate, in particular to a geometrical position at the substrate outer contour. The characteristic substrate feature, in particular its position in the X-direction, Y-direction and preferably also in the Z-direction, is preferably optically detectable. On account of the size of the characteristic substrate feature, the position can be detected with an accuracy of less than 100 µm, preferably less than 10 µm, still more preferably less than 1 µm, most preferably less than 100 nm, most preferably of all less than 10 nm.

The characteristic substrate feature can in particular be a point of intersection of the straight peripheral section with the circular circumferential section of the substrate. Further characteristic features can be the notch or distinctive, micron-sized or nanometer-sized contours along the edge of the substrate. In particular, characteristic features are different for each individual substrate. According to the invention, the following in particular come into consideration as characteristic features:

- alignment marks on the outer side of the substrates and/or
- circular substrate edge section and/or
- straight substrate edge section and/or
- notch-shaped substrate edge section and/or
- points of intersection of the aforementioned features and/or
- points of intersection of tangents of the aforementioned features.

The characteristic substrate features are in particular unequivocally identifiable/assignable, stable and/or retrievable. The characteristic substrate features have an unequivocal point of reference, which can be retrieved preferably by measuring devices, particularly microscopes.

The characteristic substrate features are disposed in particular at the edge on the outer contour of the substrates or at least in a region close to the edge, i.e. the periphery, so that the measuring devices can detect them during the approach and up to the contacting of the substrates in the bonding system. Furthermore, characteristic substrate features lying farther outwards permit increased alignment accuracy.

By means of the characteristic substrate features, an unequivocal fixed point in relation to the alignment marks present on the substrate surface, in particular on the inner side of the substrates, can preferably be defined, in particular calculated. The surfaces that are later bonded (contact surfaces) are inside or the inner side. The surfaces lying opposite the inner sides are outside or the outer side.

The characteristic substrate features can be located on the same substrate surface as the alignment marks or (preferably) on the substrate surface lying opposite the alignment marks or (still more preferably) at the side edge. If the characteristic substrate features are to be located on the same substrate surface as the alignment marks and if the alignment marks are to be located on the inner side, therefore on the surfaces that are bonded according to the invention, the characteristic features are preferably disposed, as far as possible, at the periphery of the substrates, in order that optical devices can detect them in the bonding chamber, preferably during the entire approach procedure.

The characteristic substrate features are preferably parts of the substrate and have not been introduced into the substrate as such before the process according to the invention. It would however also be conceivable to produce characteristic substrate features, in particular by producing patterns on the outer surface of the substrates, on the substrate outer contour or on the side edge, in particular by means of a laser, an etching process or a lithographic production process. The alignment thus becomes independent of alignment marks that are specified in particular by third parties. It is also conceivable to produce very fine etching pits at the outer periphery of the substrate.

The System

In a first embodiment according to the invention, the system comprises a bonding chamber and at least one assignment module, in particular a lock, preferably two locks, in particular connected in parallel and/or disposed beside one another. In special embodiments, more than two locks can be present in order to increase the throughput further. The number of locks is in particular greater than 2, preferably greater than 3, still more preferably greater than 5. A system with precisely two locks (preferred embodiment) will be described below by way of example.

The locks comprise first lock gates, which separate the locks from the surroundings, and second lock gates, which separate the locks from the bonding chamber. The lock gates can be controlled in particular manually, semi-automatically or fully automatically. The first and second lock gates can in particular be controlled independently of one another.

The bonding chamber and/or the assignment module/assignment modules can be evacuated individually. The bonding chamber and/or the assignment modules can be evacuated in particular to a pressure of less than 1 bar, preferably less than $10^{-3}$ mbar, more preferably less than $10^{-5}$ mbar, most preferably less than 10 mbar. It is also conceivable to apply an excess pressure, in particular by pumping in and/or admitting an inert gas. The bonding chamber and/or the assignment modules can then be flooded, preferably flushed, with gases or gas mixtures with a pressure greater than 1 bar, preferably greater than 2 bar, still more preferably greater than 3 bar. An, in particular exclusive, use of the bonding chamber and/or the assignment modules at ambient pressure of 1 bar is also conceivable.

The bonding chamber is flushed, especially when use is made of a thermocompression bonder, with inert gases or gases which prevent, at least delay or preferably even reverse renewed oxide formation. The use of any gas mixtures is also conceivable. The following gases or gas mixtures comprising the stated gases are preferably used:

- argon and/or
- helium and/or
- hydrogen and/or
- carbon dioxide and/or
- forming gas and/or
- formic acid and/or
- SF6.

Each of the assignment modules comprises in particular at least one, preferably two, still more preferably three, most preferably more than three measuring devices, with the aid of which alignment marks and/or characteristic substrate features can be measured. The measuring devices are preferably optical measuring devices, still more preferably microscopes.

In a special embodiment according to the invention, it concerns measuring devices for the edge measurement. Such a device for the edge measurement is mentioned for example in publication WO2013185803A1. The measuring devices are capable of producing an edge profile, in particular one around the entire periphery (related to the lateral boundary of the substrate). This edge profile has in particular a resolution at least in the micron range, preferably at least in the nanometer range. The edge of each substrate is unique, in particular on account of a preferred processing of the substrate and/or the production of the substrate from an ingot. As a result of this uniqueness, an in particular circular profile of the substrate edge around the entire periphery is obtained. This profile could also be defined by the fact that the diameter of the substrate differs as a function of an angle of rotation.

The resolution of the measuring devices is in particular greater than 1 mm, preferably greater than 100 µm, still more preferably greater than 1 µm, most preferably greater than 100 nm, most preferably of all greater than 10 nm.

A magnification of the measuring devices, in particular of the microscopes, is in particular better than the factor 1, preferably better than the factor 10, still more preferably better than the factor 1000, most preferably better than the factor $10^5$, most preferably of all better than the factor $10^7$.

The measuring devices are adjustable, in particular in translation and/or rotation, so that they can be freely displaced and/or rotated inside the assignment modules. An adaptation of the measuring devices to the size of the substrates and/or the pre-positioning in relation to the alignment marks and/or characteristic substrate features is thus possible.

In particular, such a pre-positioning of the measuring devices is carried out only once in the case of one type of substrate and/or an identical process, so that the parts of the substrate to be measured after the loading of the substrate into the lock are already disposed in the field-of-view (FOV). In addition, the alignment marks and/or characteristic substrate features to be measured are brought into t depth range (depth-of-focus, DOF), in order to obtain a sharp image with the greatest possible resolution.

The transport of the substrates out of the assignment modules into the bonding chamber and back is preferably carried out by means of a robot. The robot can be located either in a lock or in the bonding chamber. It is also conceivable for an interposed robot module to be located between the lock and the bonding chamber. If a plurality of locks are present, it is conceivable to position a robot in each lock. The positioning of the robot, however, is particularly preferably in the bonding chamber, so that access to each individual lock by a single robot can take place. The robot is preferably also able to reach ends of the assignment modules lying opposite the bonding chamber, so that the substrates can preferably be loaded not only from the assignment modules into the bonding chamber, but also from a given wafer box, in particular a FOUP, located upstream of the assignment modules, into the assignment modules.

In particular embodiments, however, the robot loads the substrates only from the locks into the bonding chamber, whilst the loading of the locks takes place from the exterior, in particular by means of a further, in particular external, robot.

A robot is understood to mean any kind of machine that is able to take up the substrates, transport them over a certain distance and set them down again.

Located in the bonding chamber is a bonding device, in particular a fusion bonder, more preferably a thermocompression bonder. The bonding device comprises a lower first sample holder and an upper second sample holder. The bonding chamber also comprises a plurality of measuring devices, in particular microscopes. The measuring devices of the bonding chamber are installed in particular on the periphery or the peripheral regions (lateral boundary) of the loaded substrates, so that a measurement of the characteristic substrate features can take place. By restricting the measurement to the characteristic substrate features, the measurement of the alignment marks in the bonding device can be dispensed with. A number of advantages result from this:

a) The measurement can also take place during the approach of the substrates and up to making contact,
b) The bonding device can be designed smaller, so that less volume has to be subjected to an atmosphere defined for the bonding or a defined gas pressure,
c) The bonding is accelerated.

As a result of the inventive measurement of the alignment marks in relation to the characteristic substrate features taking place in the assignment module(s), an approach (Z-direction) and bonding of the substrates with simultaneous measurement and in-situ monitoring is enabled on the basis of the characteristic substrate features, wherein the alignment marks are aligned (indirectly measured). The position of the alignment marks in the X-Y plane is thus calculated on the basis of the X-Y positions of the characteristic substrate features.

The Process

All the substrates can undergo a preliminary treatment before being loaded into the locks. The preliminary treatments can in particular be cleaning processes, in particular the removal of oxides, and/or
amorphisation of the surface and/or
etching processes and/or
lithographic processes, in particular
photolithographic processes
imprint lithographic processes.

Oxide removal and/or amorphisation preferably takes place by means of a unit such as is mentioned in publication PCT/EP2014/063303.

In a first step according to the invention, loading of a first lock (more generally: assignment module) takes place. The second lock gate, which connects the lock to the bonding chamber, is next closed. The first lock gate, which connects the surroundings to the lock, is then opened. Loading of the first lock with a first substrate then follows. After the loading of a first substrate into the first lock, the first lock gate is closed again.

After the closing of an evacuation process begins. The evacuation is thus limited in particular to the relatively small lock designed as compact as possible. According to the invention and therefore preferably, a measurement of the substrate surface of the loaded substrate is carried out during the evacuation.

A plurality of measuring devices measure the X-positions and Y-positions of first and second (and if need be further) alignment marks on the substrate surface as well as at least one, preferably at least two, most preferably at least three characteristic substrate features. The measuring devices are calibrated with one another in such a way that they can ascertain the exact position and/or the orientation of the alignment marks in relation to the characteristic substrate features. The positions and, as the case may be, the orientations of the alignment marks in relation to the characteristic substrate features are thus determined unequivocally (assignment).

These data/this information are/is stored in respect of the given substrate using firm- and/or hard- and/or software.

According to the invention, the measurement should not take longer than the evacuation of the lock, so that the process can be carried out in the optimum manner with regard to the throughput. In particular, no additional process time is required for the measurement.

During the first process step according to the invention, a further, in particular second substrate can be loaded, in particular simultaneously, into a further, in particular second lock (more generally: assignment module), and thus be processed in the same way as in the first lock.

Inasmuch as a single robot is used for the transport of the substrates, the transport of the substrates cannot take place simultaneously. According to the invention, it is preferable that at all times only one robot has access to the bonding system, in particular to the sample holders for receiving the substrates. A process-related delay thus arises between the first and the second substrate. The loading of a substrate, the evacuation of a lock, and the unloading of the substrate into the bonding chamber will not therefore proceed in a wholly synchronous manner, but preferably predominantly so. The unloading of the second substrate can thus be referred to as a third process step.

In a second process step according to the invention, the second lock gate of the first lock is opened to the bonding chamber. At this time, the bonding chamber has in particular the pressure of less than 1 bar, preferably less than $10^{-3}$ mbar, still more preferably less than $10^{-5}$ mbar, most preferably less than $10^{-8}$ mbar. After a single evacuation, the bonding chamber is preferably no longer flooded during a large number of bonding processes. This is only necessary again in the case of an interruption in the bonding, in particular for maintenance and/or repair work.

A robot takes up the already measured and assigned first substrate out of the first lock and positions it on one of the two sample holders in the bonding chamber of the bonding system. The robot preferably performs a pre-positioning (pre-alignment). Once the substrate has been removed from the lock, the second lock gate can be closed again and locked and the first lock gate can be opened in order to load a new substrate into the first lock. A new process can thus already start when the old one has still not been completed.

In a third process step according to the invention, the second substrate is loaded into a second lock. The second lock can be designed identical to the first lock. In particular, it is conceivable that the second measuring devices have a second measuring direction opposite to a first measuring direction of the measuring devices of the first lock. In relation to the first substrate, the opposite side, preferably the underside, of the second substrate can thus be measured. The robot then finds the second substrate already in the correct orientation for the bonding with the first substrate. A substrate can in particular be rotated in a so-called flip module before it is loaded into the lock. This is a module which is able to rotate a substrate, in particular large substrates, through 180°. The rotation takes place about an axis which lies inside the plane of the substrate. An additional rotation about an axis lying normal to the substrate surface is also conceivable so as to perform a pre-alignment process. This pre-alignment process takes place either in the flip module or is carried out in a separate pre-aligner. The use of a robot which can rotate a fixed substrate through 180° is however also conceivable. The loading, measurement and unloading of the second substrate takes place simultaneously or with a time lag in respect of the second process step.

According to the invention, it is conceivable that further substrates in further locks are fed to the bonding chamber, either to bond more than two substrates or to prepare further substrates for the next bonding process and thus to increase the throughput.

In a fourth process step according to the invention, a measurement of the characteristic substrate features of the substrates by the measuring devices takes place in the bonding chamber. An essential advantage according to the invention, especially with regard to aligners such as mentioned in publications PCT/EP2013/075831, WO201402106A1 or U.S. Pat. No. 6,214,692B1, is that the alignment of the substrates now takes place exclusively on the basis of the characteristic substrate features and extremely short travel paths are required for this. However, the alignment marks of the substrates are brought indirectly into congruence by the alignment process, since the relationship between the alignment marks and the characteristic substrate features is known as a result of the inventive measurement in the assignment modules, in particular locks. The two substrates to be bonded are preferably already pre-positioned by the robot, in order that the characteristic substrate features can more easily be detected by the measuring devices for the precise alignment of the substrates. With its technically specified precision, the robot endeavours to achieve an approach of the characteristic substrate features of the substrates towards one another that is as good as possible. Data from the measurement of the substrates in the lock can also be used for this purpose.

The fine adjustment (precise alignment) of the characteristic substrate features in relation to one another then takes place by means of the sample holders, which can be moved, in particular displaced and rotated, in the X-direction and Y-direction. The position and/or the orientation of the characteristic substrate features are continuously measured during the displacement of the substrates in relation to one another and relayed to firm- and/or hard- and/or software, which calculates the new position of the sample holders and therefore of the substrates from the transmitted data.

An aspect according to the invention lies in particular in the fact that the (in particular all the) characteristic substrate features are located at the periphery, in particular at the outer edge (lateral boundary edge or outer contour in the X-Y plane) of the substrates, still more preferably on their outer surfaces, and are therefore easily accessible. Whilst it is true that, according to the invention, the characteristic substrate features in particular are detected, referenceable alignment marks are aligned in relation to one another by the assignment that has taken place in the assignment modules.

The assignment and calculation of the positioning can take place in particular by vector calculation in a central control system.

Inasmuch as process features are disclosed, the latter are also deemed to be disclosed according to the device and vice versa.

Further advantages, features and details of the invention will emerge from the following description of preferred examples of embodiment and with the aid of the drawings.

In the figures, identical or identically acting parts are marked with uniform reference numbers, wherein the size ratios serve the purpose of illustration and are not therefore true to scale.

DETAILED DESCRIPTION OF THE INVENTION

Figure 1:
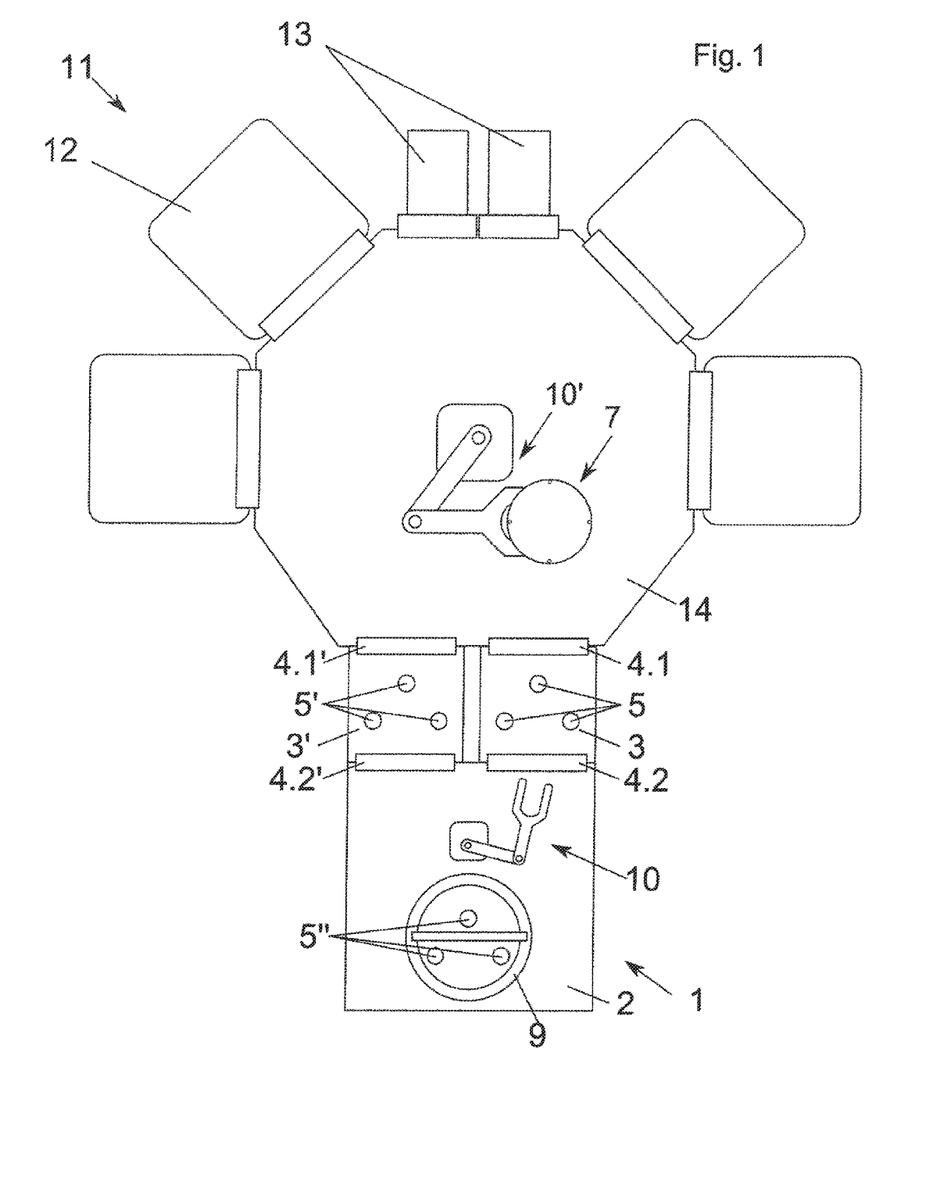
FIG. 1 shows a diagrammatic plan view, not true to scale, onto an embodiment of a cluster with a device accorded to the invention.

FIG. 1 shows a cluster system 11 comprising the following equipment:
different and/or identical modules 12 for the processing of substrates 7, 7',
a device 1, constituted here as a module of cluster system 11, with first lock gates 4.1, 4.1', two assignment modules 3, 3' and a bonding chamber 2,
a transfer chamber 14, in particular able to be evacuated,
a robot 10', which is used for the movement (in particular loading) of substrates 7, 7' and
FOUR's 13 for supplying substrates 7, 7' into transfer chamber 14 of cluster system 11.

Device 1 according to the invention can however also be operated independently of a cluster 11.

Modules 12 can in particular be devices for the treatment (application of layers, amorphisation, plasma activation, cleaning, in particular oxide removal etc.) of surfaces, in particular substrate surfaces 7o, 7o' of substrates 7, 7' to be brought into contact and bonded in bonding chamber 2.

Two first and second assignment modules 3, 3' constituted as locks are disposed upstream of bonding chamber 2. The locks are each connected via first lock gates 4.1, 4.1' to transfer chamber 14 (or, in the case of an independent device 1, to the surroundings) and via second lock gates 4.2, 4.2' to bonding chamber 2.

Located in the locks are a plurality of displaceable and/or rotatable measuring devices 5, 5', with which first and second alignment marks 8, 8' and first and second characteristic substrate features 9, 9' of first and second substrates 7, 7' are measured.

By adjusting measuring devices 5, 5' in relation to one another, an unequivocal X-Y position and orientation of alignment marks 8, 8' in relation to characteristic substrate features 9, 9' can be determined in each case. The assignment is calculated by means of a vector calculation in a central control system and stored in relation to respective first and second substrates 7, 7'.

A robot 10 transports measured substrates 7, 7', after opening of second lock gates 4.2, 4.2', out of the respective locks into bonding chamber 2 and deposits them in each case on first and second sample holders (not represented) in bonding device 6 in a pre-aligned position.

The X-Y positions of characteristic substrate features 9, 9' are ascertained by means of measuring devices 5". By means of the assignment previously carried out, an alignment of the characteristic substrate features 9, 9' is performed, wherein alignment marks 8, 8' are aligned in relation to one another in the optimum manner by corresponding movement of the sample holders.

Figure 2A:
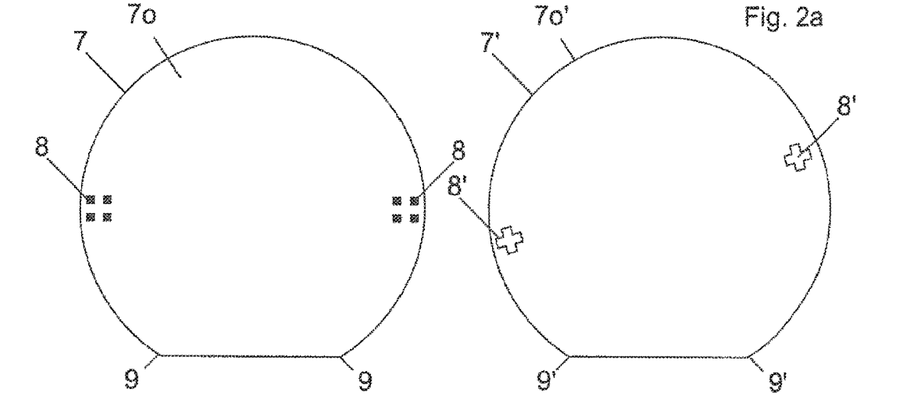
FIG. 2a shows a diagrammatic plan view onto an embodiment of the substrate with alignment marks and characteristic features.

FIG. 2a shows a diagrammatic plan view, not to scale, of two substrates 7, 7' (on the left: first substrate 7; on the right: second substrate 7'). Substrates 7, 7' have on their substrate surfaces 7o, 7o' in each case two first and two second alignment marks 8, 8' and in each case two first and two second characteristic substrate features 9, 9'. More than two alignment marks 8, 8' and/or more than two characteristic substrate features 9, 9' can also be provided in each case.

In particular, the points of intersection or transitions of the flat side of substrates 7, 7' with the circular periphery of substrates 7, 7' are unequivocal characteristic substrate features 9, 9' of substrates 7, 7' (when the latter are present with a large number of wafers). The advantage of these characteristic substrate features 9, 9' is that each substrate has precisely two such characteristic substrate features 9, 9'.

Second alignment marks 8' of second substrate 7' have intentionally been represented diverging markedly from a position to be assumed as ideal, in order better to represent the effect according to the invention.

Figure 2B:
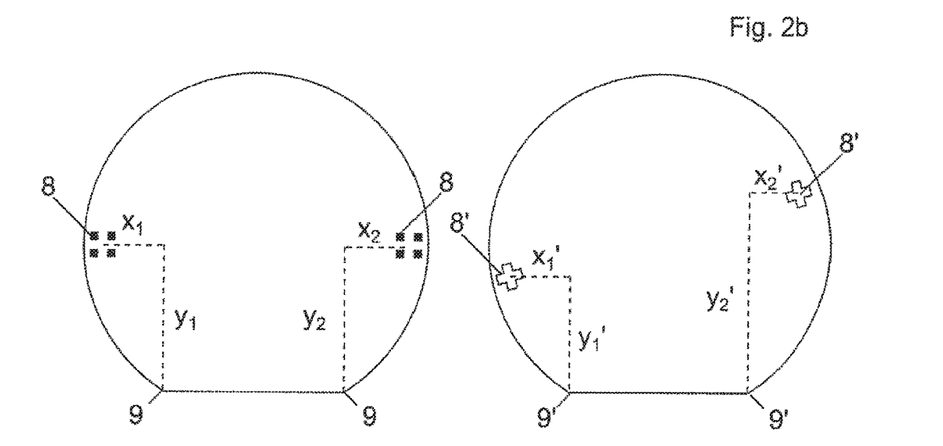
FIG. 2b shows a diagrammatic plan view according to FIG. 2a in an assignment step according to the invention.

FIG. 2b shows the X- and Y-positions x1, y1, x2, y2, ascertained by measurement, of first alignment marks 8 of first substrate 7 in relation to first characteristic substrate features 9 as well as the X- and Y-positions x1', y1', x2', y2' of second alignment marks 8' of second substrate 7' in relation to second characteristic substrate features 9'. An assignment of characteristic substrate features 9, 9' to alignment marks 8, 8' can thus be carried out at least in the X-Y plane defined by substrate surfaces 7o, 7o'.

Figure 2C:
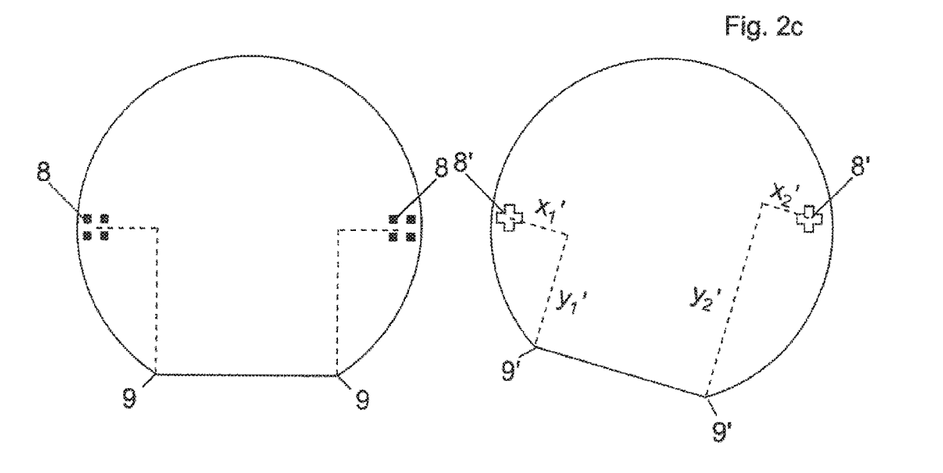
FIG. 2c shows a diagrammatic plan view according to FIG. 2a in an alignment step according to the invention.

FIG. 2c shows the orientation of substrates 7, 7' after an inventive alignment process of the two substrates 7, 7' by measuring the X-Y positions of characteristic substrate features 9, 9' and after transfer of substrates 7, 7' into bonding chamber 2. After alignment and contacting and after the bonding, alignment marks 8, 8' are disposed congruent or aligned with one another in the Z-direction. FIG. 2c shows, for purposes of illustration, only the orientation of substrates 7, 7' in the X-Y plane, without substrates 7, 7' being arranged one above the other.

Figure 3:
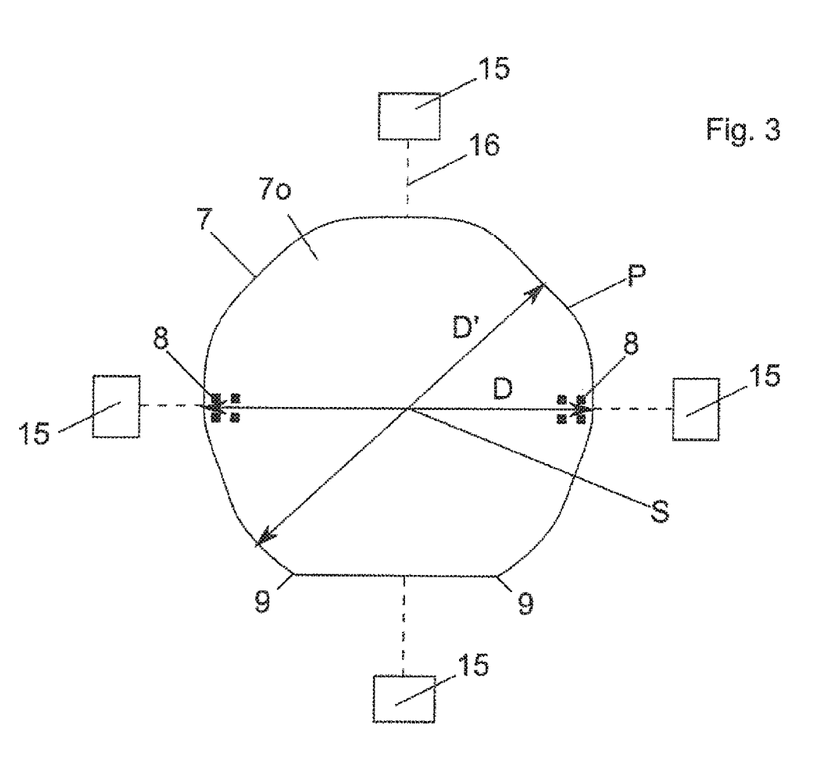
FIG. 3 shows a diagrammatic plan view onto a measuring device for measuring the substrates and FIG. 4 shows a process flow according to the invention.

FIG. 3 shows very diagrammatically diameters D, D' of one of substrates 7, 7', said diameters intersecting in point of intersection S and diverging from one another (represented in exaggerated form). The asymmetry of the substrates or the diameter at different angles of rotation amounts in reality to only a few microns or nanometers. According to a preferred embodiment of the invention, the profile of a rotating substrate 7, centred and mounted in particular at the centre of gravity, is measured by measuring device 15.

These measuring devices use in particular an interferometer to measure the position from the source to the edge of substrates 7, 7,' in particular by means of a laser beam 16. A continuous recording of a substrate profile P can be achieved by the targeted positioning of a plurality of such interferometers 15, in particular at equidistant angular distances. This profile is used in particular as a further characteristic substrate feature 9" for the precise alignment of the substrates during bonding.

Figure 4:
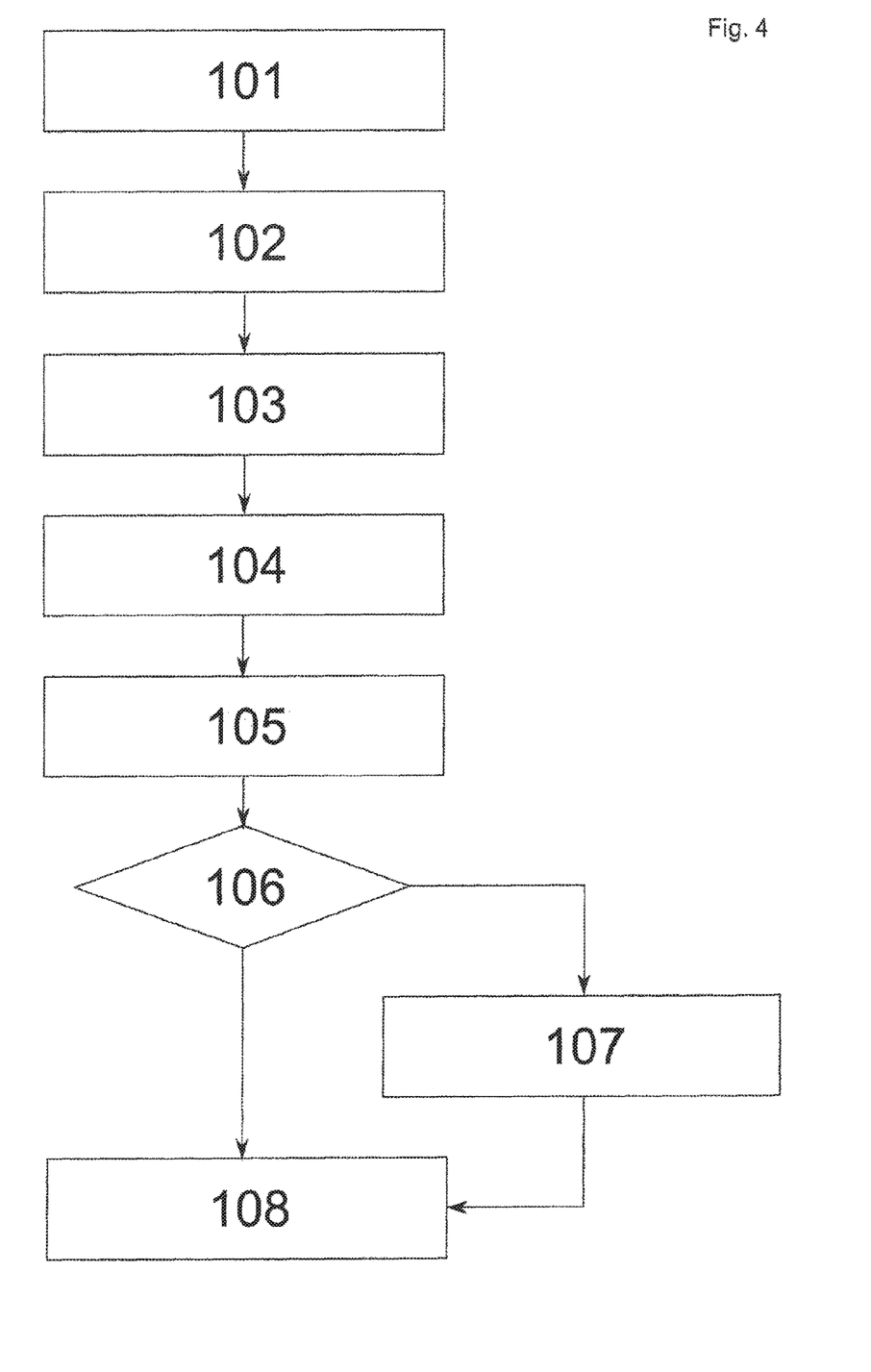

FIG. 4 shows a diagrammatic process flow for one of the two substrates 7, 7'. In the first place (step 101), appropriate preliminary treatment steps on one of substrates 7, 7' can take place on a cluster device 11, in particular in modules 12, insofar as device 1 according to the invention is part of a cluster system 11. If device 1 according to the invention is not part of a cluster 11, the optional preliminary treatment steps can take place in modules separated from one another.

Thereafter (step 102), substrate 7, 7' is loaded, in particular with the aid of a robot 10', into one of the two locks 3, 3'.

Next (step 103), evacuation and, according to the invention, in particular simultaneous measurement of characteristic substrate features 9, 9' in relation to alignment marks 8, 8' takes place (assignment).

Thereafter (step 104), the transfer takes place into bonding chamber 2, in particular by means of a robot 10.

Robot 10 already endeavours to deposit substrates 7, 7' with the highest possible precision (step 105), in particular such that now only a z-approach of the two substrates, i.e. a bonding process, has to take place.

If the alignment accuracy achieved by robot 10 is not sufficient (step 106), a precise alignment will take place on the basis of the already pre-measured characteristic substrate features 9, 9' (step 107). In a last step (step 108), bonding of the two substrates 7, 7' takes place.

The substrate stack thus produced can then be removed again from the bonding module. The unloading preferably takes place via one of the two locks 3, 3', while a new substrate 7, 7' can already be loaded in the other lock 3, 3'.

LIST OF REFERENCE NUMBERS 1 device
2 bonding chamber
3, 3' assignment modules, in particular locks
4.1, 4.1' first lock gates
4.2, 4.9' second lock gates
5, 5', 5" measuring devices, in particular microscopes
6 bonding device
7, 7' substrates
7o, 7o' substrate surfaces
8, 8' alignment marks
9, 9' characteristic substrate features
10 robot
11 cluster
12 module
13 FOUP
14 transfer chamber
15 interferometer
16 laser beam
D, D' diameter
S centre of gravity
P substrate profile Having described the invention, the following is claimed:

1. A method for alignment of substrates, wherein the method comprises:
providing a first substrate having at least two alignment marks and at least two first characteristic substrate features that comprise a physical characteristic of the first substrate;
providing a second substrate having at least two alignment marks and at least two second characteristic substrate features that comprise a physical characteristic of the second substrate;
assigning the first alignment marks in positional relation to the at least two respective first characteristic substrate features of the first substrate in an X-direction and in a Y-direction,
assigning the second alignment marks in positional relation to the at least two second characteristic substrate features of the second substrate in the X-direction and in the Y-direction, and
aligning the first and second alignment marks in relation to one another in the X- and Y-direction on the basis of positions of the first and second characteristic substrate features.

2. The method according to claim 1, wherein, after assigning the first and second alignment marks and before aligning the first and second alignment marks, transferring the first and second substrates into a bonding module, in which the aligning of the first and second alignment marks is carried out.

3. The method according to claim 1, wherein assigning of the first alignment marks takes place in a first assignment module, constituted as a lock, and assigning of the second alignment marks takes place in parallel with assigning of the first alignment marks in a second assignment module, constituted as a lock.

4. The method according to claim 3, wherein, before aligning the first and second alignment marks in relation to each other, a gas pressure in the first and/or second assignment module is reduced.

5. The method according to claim 1, wherein the first and/or second characteristic substrate features are each respectively disposed on a lateral edge of the first and second substrate.

6. The method according to claim 1, wherein one or more of features listed below are first and/or second characteristic substrate features:
   a circular substrate edge section, and/or
   a flat substrate edge section, and/or
   a notch-shaped substrate edge section, and/or
   points of intersection of the circular edge section, the flat substitute edge section and/or the notch-shaped substrate edge section, and/or
   points of intersection of tangents of the circular edge section, the flat substitute edge section and/or the notch-shaped substrate edge section.

7. A device for alignment of substrates, the device comprising:
   a first processing module for processing a first substrate having at least two alignment marks and at least two first characteristic substrate features that comprise a physical characteristic of the first substrate;
   a second processing module for processing a second substrate having at least two alignment marks and at least two second characteristic substrate features that comprise a physical characteristic of the second substrate;
   a first assignment module for assigning the first assignment marks in positional relation to the at least two respective first characteristic substrate features of the first substrate in an X-direction and in a Y-direction,
   a second assignment module for assigning the second assignment marks in positional relation to the at least two respective second characteristic substrate features of the second substrate in an X-direction and in a Y-direction, and
   an alignment module that is a bonding module, for aligning the first and second alignment marks in relation to one another in the X- and Y-direction on the basis of positions of the first and second characteristic substrate features.

8. The device according to claim 7, wherein the first and second assignment modules are locks to the alignment module.

9. The device according to claim 7, wherein the device further comprises:
   first measuring means disposed in the first and second assignment modules, for measuring X-coordinates and Y-coordinates of the first and second alignment marks,
   second measuring means disposed in the first and second assignment modules, for measuring X-coordinates and Y-coordinates of the first and second characteristic substrate features, and
   third measuring means disposed in the alignment module, for detecting X'-coordinates and Y'-coordinates of the first and second characteristic substrate features.

10. The method according to claim 2, wherein the first and second alignment marks are aligned in the bonding module under a gas pressure less than 1 bar.

11. The method according to claim 4, wherein the gas pressure is reduced in the first and/or second assignment module during assignment of the first and/or second alignment marks.

12. The method according to claim 4, wherein the gas pressure in the first and/or second assignment module is reduced to less than 1 bar.

13. The method according to claim 1, wherein, prior to the steps of assigning, performing steps of:
   measuring positions of the at least two first alignment marks of the first substrate with respect to positions of the at least two respective first characteristic substrate features; and
   measuring positions of the at least two second alignment marks of the second substrate with respect to positions of the at least two respective second characteristic substrate features.

14. The method according to claim 1, wherein the step of aligning includes rotating at least one of the first substrate or the second substrate to obtain a predetermined rotational orientation.

15. The method according to claim 1, wherein the respective alignment marks of the first substrate and second substrate are at positions spaced apart from the positions of the characteristic substrate features such that the characteristic substrate features are disposed at an outer contour of the respective substrates as defined by an X-Y plane and the alignment marks are spaced apart therefrom.

16. The method according to claim 1, wherein the first substrate and the second substrate each have a circular substrate edge section and a straight peripheral substrate edge section such that the characteristic substrate features comprise at least one of two points of intersection of the straight peripheral substrate edge section with the circular substrate edge section.

17. The method according to claim 1, wherein the first substrate and the second substrate each have a circular substrate edge section and a notch comprising at least one of the characteristic substrate features.

18. A method for alignment of substrates, wherein the method comprises:
   providing a first substrate having at least two first characteristic substrate features that comprise a physical characteristic of the first substrate;
   providing a second substrate having at least two second characteristic substrate features that comprise a physical characteristic of the second substrate;
   measuring positions of at least two first alignment marks of the first substrate with respect to positions of the at least two respective first characteristic substrate features;
   measuring positions of at least two second alignment marks of the second substrate with respect to positions of the at least two respective second characteristic substrate features;

assigning the first alignment marks in positional relation to the at least two respective first characteristic substrate features of the first substrate in an X-direction and in a Y-direction,
assigning the second alignment marks in positional relation to the at least two second characteristic substrate features of the second substrate in the X-direction and in the Y-direction, and
aligning the first and second alignment marks in relation to one another in the X- and Y-direction on the basis of the positions of the first and second characteristic substrate features.

* * * * *